United States Patent
Cho

(10) Patent No.: US 7,642,823 B2
(45) Date of Patent: *Jan. 5, 2010

(54) SEMICONDUCTOR MEMORY DEVICE INCLUDING DELAY-LOCKED-LOOP CONTROL CIRCUIT AND CONTROL METHOD FOR EFFECTIVE CURRENT CONSUMPTION MANAGEMENT

(75) Inventor: Kwang Jun Cho, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/174,000

(22) Filed: Jul. 16, 2008

(65) Prior Publication Data

US 2008/0272812 A1 Nov. 6, 2008

Related U.S. Application Data

(63) Continuation of application No. 11/648,336, filed on Dec. 29, 2006, now Pat. No. 7,414,447.

(30) Foreign Application Priority Data

Sep. 29, 2006 (KR) .................. 10-2006-0096613

(51) Int. Cl.
*H03L 7/06* (2006.01)

(52) U.S. Cl. .................. 327/156; 327/147; 327/158
(58) Field of Classification Search ................. 327/147, 327/156

See application file for complete search history.

(56) References Cited

U.S. PATENT DOCUMENTS 6,437,619 B2 * 8/2002 Okuda et al. ................. 327/158

* cited by examiner

*Primary Examiner*—Lincoln Donovan
*Assistant Examiner*—John W Poos
(74) *Attorney, Agent, or Firm*—Ladas & Parry LLP

(57) ABSTRACT

A delay-locked-loop control circuit and a method of controlling a delay-locked-loop. When the delay-locked-loop is in an off-operation mode, such as a power-down mode, a self-refresh emulation mode, a self-refresh mode, and the like, the delay-locked-loop is updated with a predetermined period, thereby preventing a malfunction of the delay-locked-loop. The delay-locked-loop has an oscillating portion which generates an oscillation signal having a predetermined period when in an OFF state; a pulse generating portion which generates a pulse signal having a predetermined period using the oscillation signal; a dividing portion which divides the pulse signal to generate a delay-locked-loop update signal; and a combining portion which combines the delay-locked-loop update signal and a delay-locked-loop on signal that is enabled by an external command to generate a delay-locked-loop control signal for controlling the delay-locked-loop.

8 Claims, 5 Drawing Sheets

SEMICONDUCTOR MEMORY DEVICE INCLUDING DELAY-LOCKED-LOOP CONTROL CIRCUIT AND CONTROL METHOD FOR EFFECTIVE CURRENT CONSUMPTION MANAGEMENT

CROSS-REFERENCE TO RELATED APPLICATIONS

The present application is a continuation of application Ser. No. 11/648,336, filed Dec. 29, 2006, now U.S. Pat. No. 7,414,447 which claims priority to Korean patent application number 10-2006-0096613 filed on Sep. 29, 2006, which is incorporated herein by reference in its entirety.

BACKGROUND OF THE INVENTION

The present invention relates to a semiconductor memory device, and more particularly, to a delay-locked-loop control circuit and a method of controlling a delay-locked-loop.

In general, a semiconductor memory device uses a variety of control methods to effectively manage current consumption.

Among them, a power-down mode, a self-refresh emulation mode, a self-refresh mode, and the like are few control methods for effectively managing current consumption related to operations of a delay-locked-loop, which compensates for a skew between an external clock and data, or an external clock and an internal clock.

Here, the self-refresh emulation mode means a mode, which operates similarly to a self-refresh by combining a pre-charge power-down operation and an auto-refresh operation.

FIG. 1 is a waveform diagram illustrating the control operation of a delay-locked-loop in a power-down mode. Referring to this, when a clock enable signal (CKE) falls to a low level, it is synchronized at a next rising edge of an external clock (CLK), and a power-down signal (PWDN) is enabled.

If the power-down signal (PWDN) is enabled, a semiconductor memory device enters into a power-down mode, and particularly in case of a pre-charge power-down mode, which enters into a power-down mode when all banks are in a pre-charge state, a delay-locked-loop is turned off or enters into a standby state to reduce the current consumption of the memory chip.

In other words, if the power-down signal (PWDN) is enabled when all banks are in a pre-charge state, a signal (DLL_ON) for turning on the delay-locked-loop by the power-down signal (PWDN) is disabled, and the delay-locked-loop is turned off or enters into a standby state.

Similar to this, also in a self-refresh mode, the delay-locked-loop is turned off or enters into a standby state by a self-refresh command, thereby reducing the current consumption by the delay-locked-loop.

At this time, if the power-down mode or the self-refresh mode is maintained for a long time, or a change occurs in the power or the like, malfunction may occur since the delay-locked-loop cannot perform an update sufficiently.

Looking into this in detail with reference to FIG. 2, the specification for a self-refresh mode specifies that, a chip is accessible after a duration of 'tXSNR (Exit Self Refresh To A Non-Read Command time)' if a read command is not inputted, and a chip is accessible after a duration of 'tXSRD (Exit Self Refresh To A Read Command time)' if a read command is inputted.

The 'tXSNR' can be defined as 'tRFC (Refresh To Active/Refresh Command time)+10*tCK', and the 'tXSRD' can be defined as '200*tCK'.

However, a chip can be accessed faster in a self-refresh emulation mode than in the self-refresh mode. In other words, a chip can be accessed 'tXP (Exit Precharge Power-Down To Any Non-Read Command time)' later when a read command is not inputted, or 'tXPRD (Exit Precharge Power-Down To Read Command time)' later when a read command is inputted.

Here, the 'tXP' can be defined as '2*tCK', and 'tXPRD' can be defined as 'tXP+tRCD (RAS To CAS Delay)-AL (Additive Latency)'.

A refresh operation can progress as an internal operation of the memory chip even if an auto-refresh command ('A' of FIG. 2) is inputted during a high interval of the clock enable signal CKE.

Accordingly, in the self refresh emulation mode, a case may occur that it is maintained high for a minimum pulse holding time of the clock enable signal CKE, '3*tCK', and then maintained low for 'tREFI (Average Periodic Refresh Interval).'

In this case, a high interval of the clock enable signal CKE, which is a possible interval for updating the delay-locked-loop, is very short, and the update time of the delay-locked-loop (typically, a time between '5*tCK' and '20*tCK') is not sufficiently ensured, thereby causing a malfunction of the delay-locked-loop, and accordingly there is a problem that data may not be normally outputted.

SUMMARY OF THE INVENTION

Accordingly, the present invention provides novel ways to update the delay-locked-loop with a predetermined period regardless of a clock enable signal, an external command, or the like, thereby reducing the chance of malfunction of the delay-locked-loop.

The present invention also provides novel ways to secure an update time of the delay-locked-loop, thereby reducing the chance of an error during a read operation by the delay-locked-loop.

The delay-locked-loop control circuit according to an embodiment of the present invention includes an oscillating portion which generates an oscillation signal having a predetermined period when the delay-locked-loop is in an OFF state; a pulse generating portion which generates a pulse signal having a predetermined period using the oscillation signal; a dividing portion which divides the pulse signal to generate a delay-locked-loop update signal; and a combining portion which combines the delay-locked-loop update signal and a delay-locked-loop on signal that is enabled by an external command to generate a delay-locked-loop control signal for controlling the delay-locked-loop.

In the above configuration, the oscillating portion is preferably enabled when it is in any one of a power-down mode, a self-refresh emulation mode, and a self-refresh mode to generate the oscillation signal having a predetermined period.

Furthermore, the pulse generating portion preferably generates the pulse signal having the same period as that of the oscillation signal, and particularly generates the pulse signal which is enabled when the oscillation signal is enabled.

Such a pulse generating portion preferably includes a delay inversion portion which delays and inverts the oscillating signal; and a combining which combines an output signal of the delay inversion portion and the oscillation signal to output to the pulse signal.

At this time, the delay inversion portion preferably includes an inverter chain having an odd number of inverters connected serially to one another, and the combining includes a NAND gate which performs a NAND combination for an output signal of the delay inversion portion and the oscillation signal; and an inverter which inverts an output signal of the NAND gate to output to the pulse signal.

The dividing portion preferably divides the pulse signal to generate the delay-locked-loop update signal having a pulse width between 5 and 20 cycles of the external clock.

Moreover, the combining portion preferably generates the delay-locked-loop control signal which is enabled when either one of the delay-locked-loop update signal and the delay-locked-loop on signal is enabled, and disabled when both of the delay-locked-loop update signal and the delay-locked-loop on signal are disabled.

At this time, the delay-locked-loop on signal is preferably enabled when a read command is inputted, and disabled when entering into any one of a power-down mode, a self-refresh emulation mode, and a self-refresh mode.

Such a combining portion preferably includes a NOR gate which performs a NOR combination for the delay-locked-loop update signal and the delay-locked-loop on signal; and an inverter which inverts an output signal of the NOR gate to output to the delay-locked-loop control signal.

In order to accomplish the aforementioned object, a semiconductor memory device according to an embodiment of the present invention has a delay-locked-loop which is enabled in a read operation to compensate for a skew between an internal clock and an external clock; an oscillating portion which generates an oscillation signal having a predetermined period when the delay-locked-loop is in an OFF state; and a delay-locked-loop controller which generates the delay-locked-loop update signal for updating the delay-locked-loop as an oscillation signal.

In the above configuration, the oscillating portion is preferably enabled when it is in any one of power-down mode, self-refresh emulation mode, and self-refresh mode to generate the oscillation signal having a predetermined period.

Furthermore, the delay-locked-loop controller preferably includes a pulse generating portion which generates a pulse signal having a predetermined period using the oscillation signal; and a dividing portion which divides the pulse signal to generate the delay-locked-loop update signal as the external clock.

Here, the pulse generating portion preferably generates the pulse signal having the same period as that of the oscillation signal, and particularly generates the pulse signal which is enabled when the oscillation signal is enabled.

Such a pulse generating portion preferably includes a delay inversion portion which delays and inverts the oscillating signal; and a combining which combines an output signal of the delay inversion portion and the oscillation signal to output to the pulse signal.

At this time, the delay inversion portion preferably includes an inverter chain consisting of an odd number of inverters connected serially to one another, and the combining includes a NAND gate which performs a NAND combination for an output signal of the delay inversion portion and the oscillation signal; and an inverter which inverts an output signal of the NAND gate to output to the pulse signal.

The dividing portion preferably divides the pulse signal to generate the delay-locked-loop update signal having a pulse width between 5 and 20 cycles of the external clock.

In order to accomplish the aforementioned object, a method of controlling a delay-locked-loop of a semiconductor memory device according to an embodiment of the present invention includes a first step which generates an oscillation signal having a predetermined period as an external clock when the delay-locked-loop is in an OFF state; a second step which generates a pulse signal having a predetermined period using the oscillation signal; a third step which divides the pulse signal to generate a delay-locked-loop update signal; and a fourth step which updates the delay-locked-loop as the delay-locked-loop update signal.

In the aforementioned method, the first step preferably generates the oscillation signal having a predetermined period when it is in any one of a power-down mode, a self-refresh emulation mode, and a self-refresh mode.

In the aforementioned method, the second step preferably generates the pulse signal having the same period as that of the oscillation signal, and particularly generates the pulse signal, which is enabled when the oscillation signal is enabled.

In the aforementioned method, the third step preferably divides the pulse signal to generate the delay-locked-loop update signal having a pulse width between 5 and 20 cycles of the external clock.

In the aforementioned method, the fourth step preferably turns on the delay-locked-loop for a period as long as a pulse width of the delay-locked-loop update signal.

DESCRIPTION OF SPECIFIC EMBODIMENTS

Hereinafter, preferred embodiments of the present invention will be described in detail with reference to the accompanying drawings.

Figure 1:
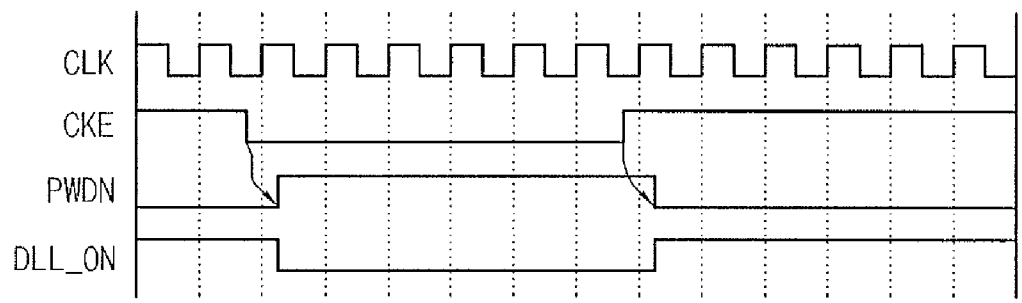
FIG. 1 is a waveform diagram illustrating an on/off operation of a delay-locked-loop in a power-down mode.
Figure 2:
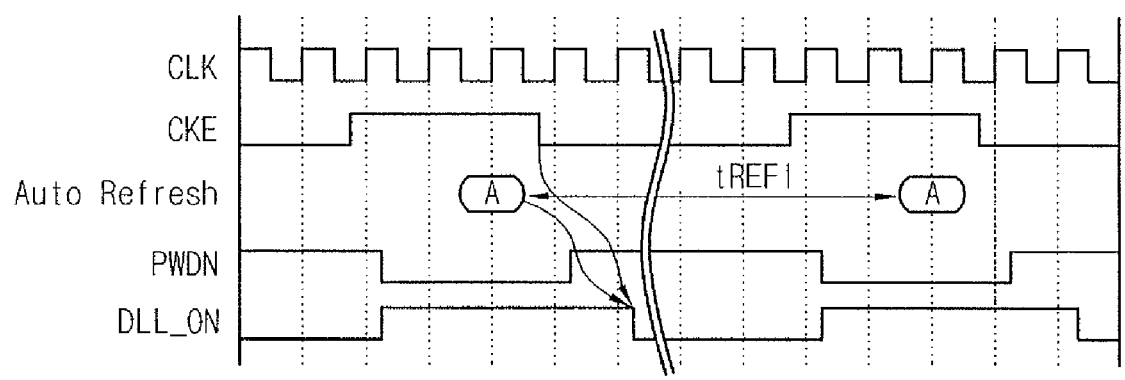
FIG. 2 is a waveform diagram illustrating an on/off operation of a delay-locked-loop in a self-refresh emulation mode.
Figure 3:
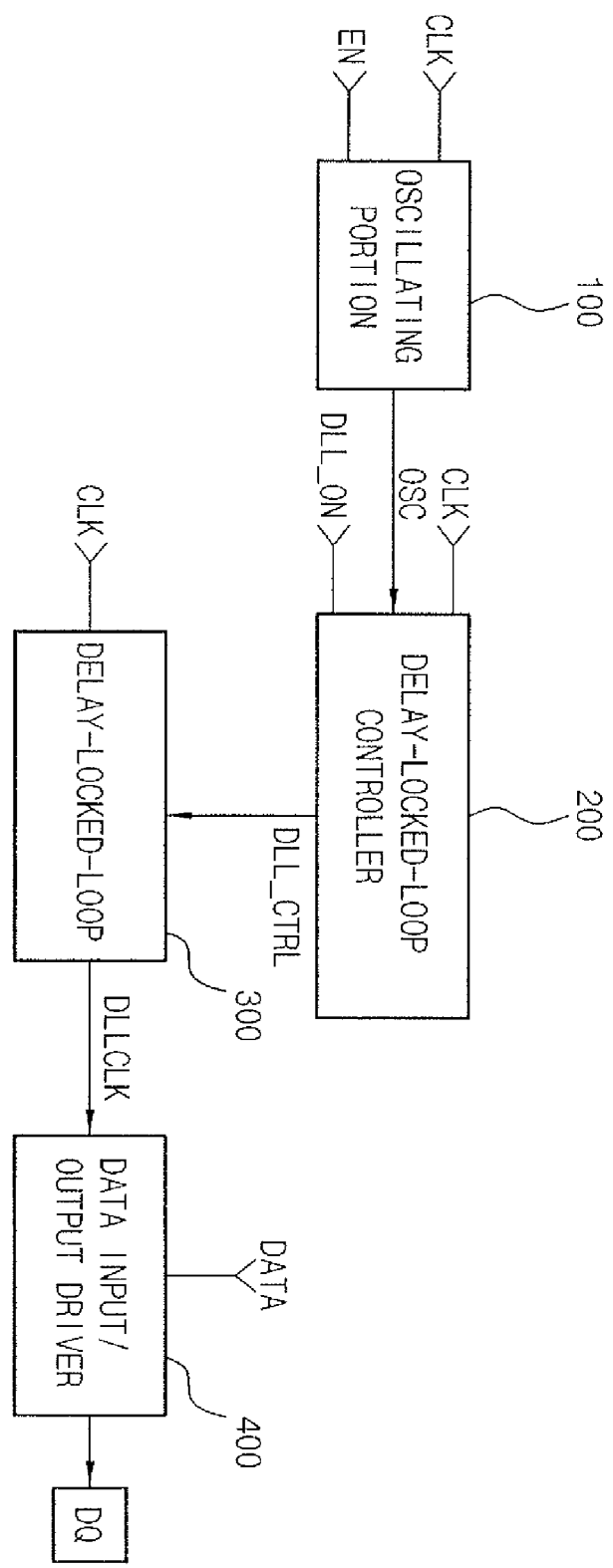
FIG. 3 is a block diagram showing part of a semiconductor memory device related to a delay-locked-loop control according to an embodiment of the present invention.

According to an embodiment of the present invention, now referring to FIG. 3, when a delay-locked-loop 300 is an off-operation mode (such as a power-down mode, a self-refresh emulation mode, a self-refresh mode, or the like), the delay-locked-loop 300 is updated with a predetermined period, thereby preventing a malfunction of the delay-locked-loop 300.

The embodiment of FIG. 3 includes an oscillating portion 100, a delay-locked-loop controller 200, a delay-locked-loop 300, a data input/output driver 400, and a data input/output pad (DQ).

The oscillating portion 100 operates by an enable signal (EN) when the delay-locked-loop 300 is in an OFF state, and generates an oscillation signal (OSC) having a predetermined period as an external clock (CLK).

At this time, the enable signal EN is enabled when the delay-locked-loop 300 is in an off-operation mode, such as power-down mode, self-refresh emulation mode, self-refresh mode, or the like.

An oscillating portion 100 can be configured with a typical oscillator or with an oscillator for determining a self-refresh period in the self-refresh mode.

Furthermore, the oscillating portion 100 preferably generates an oscillation signal (OSC) having a 0.5-4 µs period so as to sufficiently update the delay-locked-loop 300.

The delay-locked-loop controller 200 generates a delay-locked-loop control signal (DLL_CTRL) for controlling the delay-locked-loop 300 with an oscillation signal (OSC) and a delay-locked-loop on signal (DLL_ON).

Figure 4:
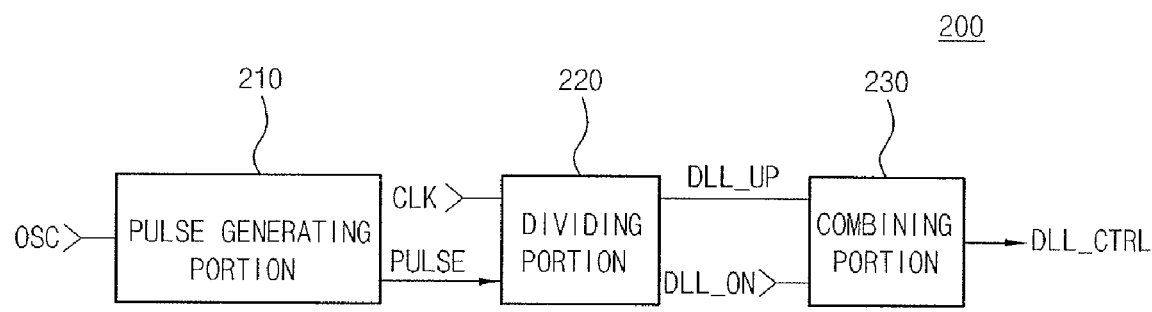
FIG. 4 is a block diagram showing a delay-locked-loop controller 200 of FIG. 3.

As an example, such a delay-locked-loop controller 200 can be configured as shown in FIG. 4, and it will be described in detail below.

The delay-locked-loop controller 200 according to an embodiment as illustrated in FIG. 4 includes a pulse generating portion 210 which generates a pulse signal (PULSE) having a predetermined period using an oscillation signal (OSC), a dividing portion 220 which divides the pulse signal (PULSE) to generate a delay-locked-loop update signal (DLL_UP), and a first combining portion 230 which combines the delay-locked-loop update signal (DLL_UP) and a delay-locked-loop on signal (DLL_ON) to generate a delay-locked-loop control signal (DLL_CTRL).

The pulse generating portion 210 generates a pulse signal (PULSE) having the same period as that of the oscillation signal (OSC) using the oscillation signal (OSC). At this time, the pulse generating portion 210 preferably generates a pulse signal (PULSE) which is enabled when the oscillation signal (OSC) is enabled.

Figure 5:
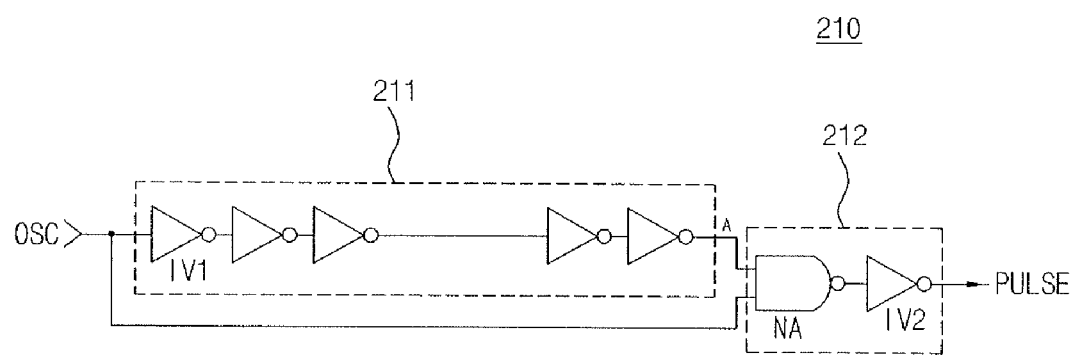
FIG. 5 is a circuit diagram showing an example of a pulse generating portion 210 of FIG. 4.

As an example, the pulse generating portion 210, as illustrated in FIG. 5, includes a delay inversion portion 211 which delays for a predetermined time and inverts the oscillating signal (OSC); and a second combining portion 212 which combines an output signal of the delay inversion portion 211 and the oscillation signal (OSC) to output the pulse signal (PULSE).

Here, the delay inversion portion 211 can include an odd number of inverters (IV1) connected serially to one another, and the second combining portion 212 can include a NAND gate (NA) which performs a NAND combination for an output signal of the delay inversion portion 211 and the oscillation signal OSC; and an inverter (IV2) which inverts an output signal of the NAND gate (NA).

Figure 6:
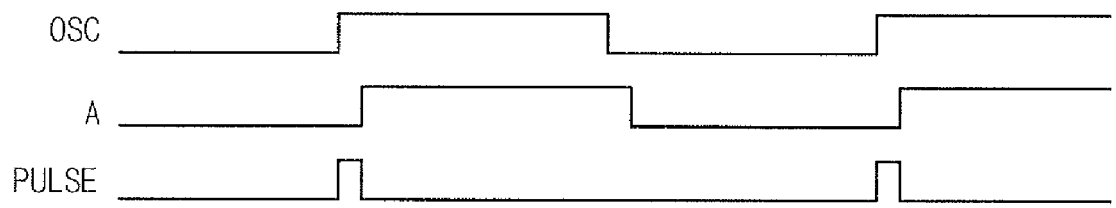
FIG. 6 is a waveform diagram illustrating an operation of FIG. 5.

The pulse generating portion 210 having such a configuration, as illustrated in FIG. 6, combines the oscillation signal (OSC) and a signal outputted to a node (A) of the second combining portion 212 to generate a pulse signal (PULSE).

At this time, the pulse signal (PULSE) is enabled when the oscillation signal (OSC) is enabled and disabled when the signal outputted to the node (A) is enabled. In other words, the pulse width of the pulse signal (PULSE) is same as the length of delay caused by the delay inversion portion 211 in outputting a pulse signal (which is the delayed OSC signal) to the node (A) as shown in FIG. 6.

The dividing portion 220 extends the pulse width of a pulse signal (PULSE) to determine the time in which the delay-locked-loop 300 can be updated.

At this time, the dividing portion 220 preferably outputs a delay-locked-loop update signal (CLL_UP) having a pulse width between 5 cycles and 20 cycles of the external clock (CLK) using a RC delay or the like. In other words, the delay-locked-loop update signal (CLL_UP) is preferably as follows: 5*tCK<(CLL_UP)<20*tCK.

The first combining portion 230 generates a delay-locked-loop control signal (DLL_CTRL) which is enabled when either one of the delay-locked-loop update signal (CLL_UP) and the delay-locked-loop on signal (DLL_ON) is enabled, and disabled when both the delay-locked-loop update signal (CLL_UP) and the delay-locked-loop on signal (DLL_ON) are disabled.

Figure 7:
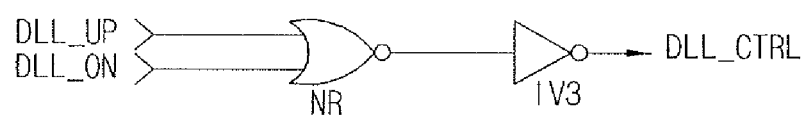
FIG. 7 is a circuit diagram showing an example of a first combining portion 230 of FIG. 4.

As an example, the first combining portion 230 according to an embodiment as illustrated in FIG. 7 includes a NOR gate (NR) which performs a NOR combination for the delay-locked-loop update signal (DLL_UP) and the delay-locked-loop on signal (DLL_ON); and an inverter (IV3) which inverts an output signal of the NOR gate (NR) to output to the delay-locked-loop control signal (DLL_CTRL).

On the other hand, the delay-locked-loop 300 is enabled by the delay-locked-loop control signal (DLL_CTRL), and compensates for a skew between an internal clock and an external clock to output to a clock (DLLCLK).

Furthermore, the data input/output driver 400 amplifies data (DATA) received from a memory cell (not shown), and then synchronizes the amplified data with an output clock (DLLCLK) of the delay-locked-loop 300 to transmit to the data input/output pad (DQ).

The delay-locked-loop 300 and the data input/output driver 400 may be implemented by utilizing known circuits for performing the above-described operations.

Figure 8:
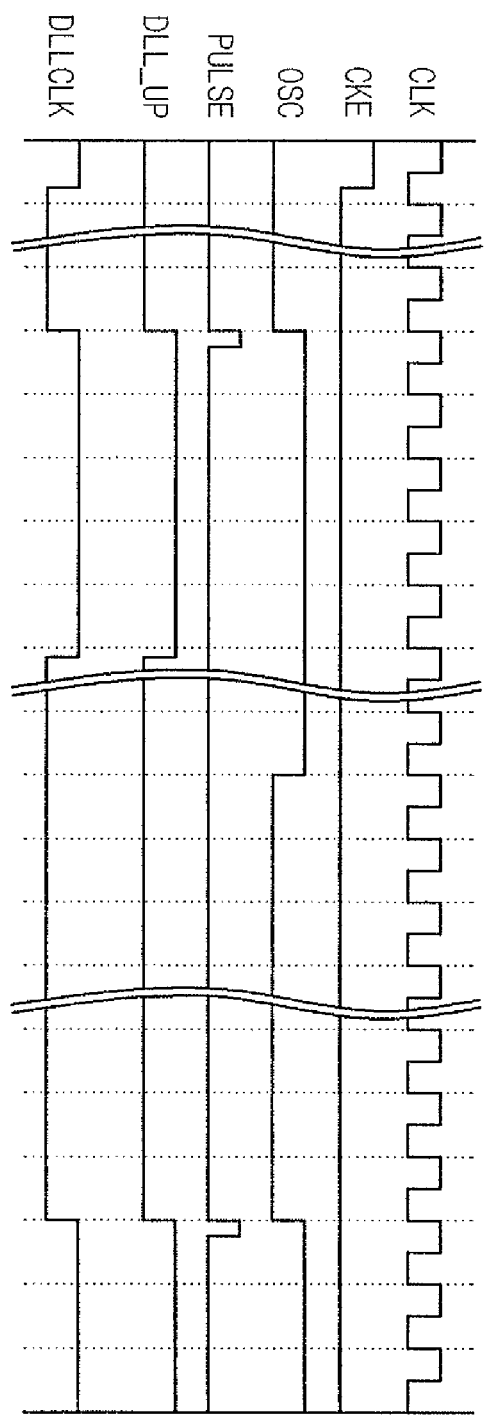
FIG. 8 is a waveform diagram illustrating an operation of FIG. 3.

In this way, an embodiment of the present invention includes a delay-locked-loop controller 200 which controls the delay-locked-loop 300 using an oscillation signal (OSC) having a predetermined period and a delay-locked-loop on signal (DLL_ON), and the operations of the delay-locked-loop controller 200 will be described in detail with reference to FIG. 8.

First, the oscillating portion 100 operates in a state that a clock enable signal (CKE) is disabled to generate an oscillation signal (OSC) having a predetermined period.

The oscillation signal (OSC) preferably has a 0.5-4 µs period, since the oscillation signal is a signal that determines an update period of the delay-locked-loop 300.

Furthermore, a pulse signal (PULSE) having the same period as that of the oscillation signal (OSC) is generated in the pulse generating portion 210, and this pulse signal (PULSE) is divided through the dividing portion 220 and outputted to a delay-locked-loop update signal (CLL_UP).

Since the delay-locked-loop update signal (CLL_UP) is a signal that determines how long the delay-locked-loop 300 will be updated, the delay-locked-loop update signal (CLL_UP) has a pulse width preferably between 5 cycles and 20 cycles based upon an external clock (CLK).

Subsequently, a delay-locked-loop on signal (CLL_ON) which is enabled when a clock enable signal (CKE) is enabled and the delay-locked-loop update signal (CLL_UP) are combined through the first combining portion 230, and outputted to a delay-locked-loop control signal (CLL_CTRL).

In other words, the delay-locked-loop 300 normally operates by the delay-locked-loop control signal (CLL_CTRL) in a read operation, and it is updated by the delay-locked-loop control signal (CLL_CTRL) with a predetermined period when the clock enable signal (CKE) is in a disabled state, such as a power-down mode, a self-refresh emulation mode, a self-refresh mode, or the like.

As described above, according to an embodiment of the present invention, when the delay-locked-loop 300 is in the off state, the delay-locked-loop 300 is updated with a predetermined period as an oscillation signal (OSC) provided from the oscillating portion 100.

Thus, according to an embodiment of the present invention, the delay-locked-loop 300 is updated with a predetermined period regardless of a clock enable signal (CKE) and an external command, thereby substantially reducing or eliminating the occurrences of malfunctioning delay-locked-loop 300.

Furthermore, according to an embodiment of the present invention, an update time of the delay-locked-loop 300 can be secured sufficiently through the dividing portion 220 when updating the delay-locked-loop 300, thereby providing an effect that the AC and DC timing of the semiconductor memory device can be guaranteed.

As described above, according to an embodiment of the present invention, when a delay-locked-loop is in an OFF state by a clock enable signal and an external command, the delay-locked-loop is updated with a predetermined period regardless of the clock enable signal and the external command, thereby providing an effect that a malfunction of the delay-locked-loop can be reduced.

Furthermore, according to an embodiment of the present invention, an update time of the delay-locked-loop can be sufficiently secured when updating the delay-locked-loop, thereby providing an effect that an error in a read operation by the delay-locked-loop can be reduced.

Though the present invention has been illustrated and described regarding a particular embodiment, the invention should not be so limited, and it will be appreciated that the invention may be altered or modified in various ways by those skilled in the art without departing from the spirit and scope of the invention as set forth in the appended claims.

I claim:

1. A semiconductor memory device, comprising:
   a delay-locked-loop updated by a delay-locked-loop update signal; and
   a delay-locked-loop controller generating the delay-locked-loop update signal having a predetermined period when the delay-locked-loop is in an OFF state responding to any one of a power-down mode, a self-refresh emulation mode, and a self-refresh mode and providing the delay-locked-loop update signal to the delay-locked-loop,
   wherein the delay-locked-loop controller comprises:
      an oscillating portion generating an oscillation signal having a predetermined period when the delay-locked-loop is in the OFF state;
      a pulse generating portion generating a pulse signal having a predetermined period using the oscillation signal; and
      a dividing portion dividing the pulse signal to generate the delay-locked-loop update signal.

2. The semiconductor memory device of claim 1, wherein the pulse generating portion generates the pulse signal having the same period as that of the oscillation signal.

3. The semiconductor memory device of claim 2, wherein the pulse generating portion generates the pulse signal which is enabled when the oscillation signal is enabled.

4. The semiconductor memory device of claim 3, wherein the pulse generating portion includes:
   a delay inversion portion delaying and inverting the oscillation signal; and
   a combining portion combining an output signal of the delay inversion portion and the oscillation signal to output to the signal.

5. The semiconductor memory device of claim 4, wherein the delay inversion portion includes an inverter chain having an odd number of inventors connected serially the one another.

6. The semiconductor memory device of claim 4, wherein the combining portion comprises:
   a NAND gate performing a NAND combination for an output signal of the delay inversion portion and the oscillation signal; and
   an inverter inverting an output signal of the NAND gate to the pulse signal.

7. The semiconductor memory device of the claim 1, wherein the dividing portion divides the pulse signal to generate the delay-locked-loop update signal having pulse width exceeding 5 cycles of the external clock.

8. The semiconductor memory device of the claim 7, wherein the Pulse width of the pulse signal is less than 20 cycle of the external clock.

* * * * *